(12) United States Patent
Sugimoto et al.

(10) Patent No.: US 8,946,686 B2
(45) Date of Patent: Feb. 3, 2015

(54) ORGANIC EL DISPLAY DEVICE WITH A MULTI-LAYERED, RESIN-BASED PLANARIZATION FILM

(75) Inventors: Hiroshi Sugimoto, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 614 days.

(21) Appl. No.: 13/319,515

(22) PCT Filed: Jan. 28, 2010

(86) PCT No.: PCT/JP2010/000507
§ 371 (c)(1),
(2), (4) Date: Nov. 8, 2011

(87) PCT Pub. No.: WO2010/146730
PCT Pub. Date: Dec. 23, 2010

(65) Prior Publication Data
US 2012/0049178 A1    Mar. 1, 2012

(30) Foreign Application Priority Data

Jun. 19, 2009 (JP) .................................. 2009-146440

(51) Int. Cl.
*H01L 29/08* (2006.01)
*H01L 35/24* (2006.01)
*H01L 51/00* (2006.01)
*H01L 27/32* (2006.01)
*H01L 51/52* (2006.01)

(52) U.S. Cl.
CPC ......... *H01L 27/3258* (2013.01); *H01L 51/5237* (2013.01)
USPC .............. 257/40; 257/E27.119; 257/E51.001; 257/E51.018; 438/46

(58) Field of Classification Search
CPC .................................................... H01L 27/3258
USPC ............. 257/40, E27.119, E51.001, E51.018; 438/46
See application file for complete search history.

(56) References Cited

U.S. PATENT DOCUMENTS

2005/0269946 A1    12/2005  Jeong et al.
2007/0105255 A1     5/2007  Nishimura

FOREIGN PATENT DOCUMENTS

| JP | 2005-310431 A | 11/2005 |
| JP | 2006-80023 A | 3/2006 |
| JP | 2007-121537 A | 5/2007 |
| JP | 2007-305318 A1 | 11/2007 |
| JP | 2008-166167 A | 7/2008 |

OTHER PUBLICATIONS

International Search Report received for PCT Patent Application No. PCT/JP2010/000507, mailed on Feb. 23, 2010, 3 pages (1 page of English Translation and 2 pages of PCT Search Report).

*Primary Examiner* — Stephen W Smoot
*Assistant Examiner* — Vicki B Booker
(74) *Attorney, Agent, or Firm* — Morrison & Foerster LLP

(57) ABSTRACT

An organic EL display device (10) includes: an insulating substrate (20); a first planarizing film (21) formed on the insulating substrate (20) and made of a resin; a first electrode (13) formed on the first planarizing film (21); an organic EL layer (17) formed on the first electrode (13); a second electrode (14) formed on the organic EL layer (17); and a second planarizing film (22) formed between the first electrode (13) and the first planarizing film (21), and covering the first planarizing film (21). The second planarizing film (22) is made of a resin having a lower hygroscopic property than the resin forming the first planarizing film (21).

7 Claims, 4 Drawing Sheets

ORGANIC EL DISPLAY DEVICE WITH A MULTI-LAYERED, RESIN-BASED PLANARIZATION FILM

CROSS REFERENCE TO RELATED APPLICATIONS

This is a U.S. National Phase patent application of PCT/JP2010/000507, filed Jan. 28, 2010, which claims priority to Japanese Patent Application No. 2009-146440, filed Jun. 19, 2009, each of which is hereby incorporated by reference in the present disclosure in its entirety.

TECHNICAL FIELD

The present invention relates to organic electroluminescence (EL) display devices including an organic EL panel having organic electroluminescence elements (hereinafter referred to as the "organic EL elements"), etc. and manufacturing methods thereof.

BACKGROUND ART

In recent years, liquid crystal display (LCD) devices have been widely used as flat panel displays in various fields. However, there still are significant challenges in the LCD devices. For example, contrast and displayed colors vary significantly depending on the viewing angle. Since the LCD devices require a light source such as a backlight, it is difficult to reduce power consumption. Moreover, reduction in thickness and weight of the LCD devices is limited. Another challenge for the LCD devices is to use the LCD devices in flexible display applications.

Recently, self light-emitting organic EL display devices using organic electroluminescence (organic EL) elements have been expected as an alternative display device to the LCD devices. The organic EL element is an element configured so that organic molecules forming an organic EL layer emit light in response to a current applied to the organic EL layer interposed between an anode and a cathode. Since the organic EL display devices using the organic EL elements are of the self light-emitting type, the organic EL display devices are advantageous in terms of reduction in thickness, weight, and power consumption, and also have a wide viewing angle. Thus, the organic EL display devices have received considerable attention as a candidate for the next-generation flat panel displays. There is also a possibility that the organic EL display devices may be superior to the LCD devices in flexible display applications as well. Taking advantage of their small thickness and wide viewing angle, the organic EL display devices have been actually increasingly used in practical applications as main displays of portable audio players or mobile phones.

This organic EL display device has a plurality of organic EL elements arranged in a predetermined pattern, and each of the plurality of organic EL elements includes a first electrode formed on an insulating substrate, an organic EL layer having a light emitting layer formed on the first electrode, and a second electrode formed on the organic EL layer. The organic EL element is provided with an edge cover in a region other than a light emitting region in order to prevent short-circuit between the first and second electrodes. Thin film transistors (TFTs) are provided on the substrate, and a planarizing film (an interlayer film) is provided in order to planarize the substrate surface and to provide insulation.

The planarizing film is made of an organic resin material such as an acrylic resin, in view of the dielectric constant and the film thickness, easiness of planarization, and high controllability of both patterning and the taper angle at pattern ends.

However, the organic resin material such as the acrylic resin tends to accumulate water therein, as compared to a material made of an inorganic component. Moreover, the acrylic resin is resistant to a temperature of up to about 250° C. Thus, even if baking is performed at 250° C. or less in the manufacturing process, it is difficult to sufficiently remove water from the planarizing film made of the acrylic resin. Accordingly, in the case where the planarizing film is made of the organic resin material, water leaks from the planarizing film, and reaches the electrodes and the organic EL layer of the organic EL element, thereby damaging the peripheral portions of the electrodes and the organic EL layer. As a result, luminance decreases in the degraded portions, causing uneven light emission.

As a solution to this problem, organic EL display devices have been proposed which are configured to prevent such damage caused by the water. More specifically, for example, an organic EL display device has been proposed which includes an organic resin film placed between a first electrode and an organic EL layer and having a low hygroscopic property, and an organic resin film placed at the boundary of the first electrode and having a relatively high hygroscopic property as compared to the organic resin film having a low hygroscopic property. This configuration can block the water leaking from the planarizing film to the organic EL layer, whereby degradation of the organic EL element is suppressed, and an organic EL display device that is less likely to be degraded can be implemented (e.g., Patent Document 1).

As another example, an organic EL display device has also be disclosed in which a first inorganic insulating film is formed in a layer below a planarizing film, and a second inorganic insulating film is formed in a layer above the planarizing film, so that the lower, upper, and side surfaces of the planarizing film are covered by the first inorganic insulating film and the second inorganic insulating film. According to the disclosure, this configuration can prevent absorption of water by the planarizing film during the manufacturing process, whereby problems resulting from absorption of water by the planarizing film can be prevented (see, e.g., Patent Document 2).

CITATION LIST

Patent Document

PATENT DOCUMENT 1: Japanese Patent Publication No. 2005-310431
PATENT DOCUMENT 2: Japanese Patent Publication No. 2007-121537

SUMMARY OF THE INVENTION

Technical Problem

However, in the organic EL display device described in Patent Document 1, the organic resin film having a high hygroscopic property is placed at the boundary of the first electrode. Thus, water that leaks from the planarizing film via the first electrode cannot be reliably blocked.

In the organic EL display device described in Patent Document 2, the planarizing film made of an organic resin material is covered by the first and second inorganic insulating films each made of an inorganic material. This reduces adhesion between the planarizing film and the first and second inorganic insulating films. Thus, water absorption of the planarizing film cannot be completely prevented, and water that has leaked from the planarizing film enters a region between the planarizing film and the first and second inorganic insulating films, causing delamination and cracks in the first and second inorganic insulating films. As a result, the water that has leaked from the planarizing film cannot be reliably blocked by the first and second inorganic insulating films.

The present invention was developed in view of the above problems, and it is an object of the present invention to provide an organic EL display device capable of blocking water leaking from a planarizing film and capable of preventing reduction in luminance and uneven light emission in an organic EL layer.

Solution to the Problem

In order to achieve the above object, an organic EL display device according to the present invention includes: an insulating substrate; a first planarizing film formed on the insulating substrate and made of a resin; a first electrode formed on the first planarizing film; an organic EL layer formed on the first electrode; a second electrode formed on the organic EL layer; and a second planarizing film formed between the first electrode and the first planarizing film, and covering the first planarizing film, wherein the second planarizing film is made of a resin having a lower hygroscopic property than the resin forming the first planarizing film.

According to the above configuration, the second planarizing film is formed so as to cover the first planarizing film made of the resin having a higher hygroscopic property. Thus, even if water has been accumulated in the first planarizing film, the water contained in the first planarizing film can be blocked and confined by the second planarizing film. This configuration can reliably prevent leakage of water from the first planarizing film to the first electrode. Thus, the water can be prevented from reaching the first electrode and the organic EL layer, thereby preventing damage to the peripheral portions of the first electrode and the organic EL layer due to the water. As a result, reduction in luminance and uneven light emission of the organic EL layer can be reliably prevented.

The second planarizing film is formed between the first electrode and the first planarizing film, and the first planarizing film made of a resin is covered by the second planarizing film made of a resin, thereby improving adhesion between the first planarizing film and the second planarizing film. Thus, accumulation of water and formation of a void in the interface between the first planarizing film and the second planarizing film can be prevented. As a result, leakage of water from the first planarizing film to the first electrode can be reliably prevented, whereby delamination and cracks can be prevented from occurring in the first planarizing film and the first electrode due to leakage of water from the first planarizing film and entrance of the water into a region between the first planarizing film and the first electrode.

In the organic EL display device of the present invention, the second planarizing film may be made of one resin selected from the group consisting of a polyimide resin, a novolac resin, and a phenol resin.

According to the above configuration, the second planarizing film, which is made of a resin having a lower hygroscopic property than a resin (e.g., an acrylic resin) forming the first planarizing film, can be formed by using a general-purpose resin material.

In the organic EL display device of the present invention, the second planarizing film may have a thickness in a range of 0.3 µm to 1.0 µm, both inclusive.

According to the above configuration, transparency of the second planarizing film can be ensured, and water contained in the first planarizing film can be blocked and confined by the second planarizing film without increasing the cost.

The organic EL display device of the present invention may further include a switching element substrate including the insulating substrate, and a switching element formed on the insulating substrate and electrically connected to the first electrode.

According to the above configuration, switching element substrates that are produced for LCD devices can be used for organic EL display devices, manufacturing cost can be suppressed in mass production of the organic EL display devices.

A method for manufacturing an organic EL display device according to the present invention includes at least the steps of: forming, on an insulating substrate, a first planarizing film made of a resin; forming, on the first planarizing film, a second planarizing film made of a resin having a lower hygroscopic property than the resin forming the first planarizing film, so as to cover the first planarizing film; forming a first electrode on the second planarizing film so that the second planarizing film is placed between the first electrode and the first planarizing film; forming an organic EL layer on the first electrode; and forming a second electrode on the organic EL layer.

According to the above configuration, the second planarizing film is formed so as to cover the first planarizing film made of the resin having a higher hygroscopic property. Thus, even if water has been accumulated in the first planarizing film, the water contained in the first planarizing film can be blocked and confined by the second planarizing film. This configuration can reliably prevent leakage of water from the first planarizing film to the first electrode. Thus, the water can be prevented from reaching the first electrode and the organic EL layer, thereby preventing damage to the peripheral portions of the first electrode and the organic EL layer due to the water. As a result, reduction in luminance and uneven light emission of the organic EL layer can be reliably prevented.

Moreover, the second planarizing film is formed between the first electrode and the first planarizing film, and the first planarizing film made of a resin is covered by the second planarizing film made of a resin, thereby improving adhesion between the first planarizing film and the second planarizing film. Thus, accumulation of water and formation of a void in the interface between the first planarizing film and the second planarizing film can be prevented. As a result, leakage of water from the first planarizing film to the first electrode can be reliably prevented, whereby delamination and cracks can be prevented from occurring in the first planarizing film and the first electrode due to leakage of water from the first planarizing film and entrance of the water into a region between the first planarizing film and the first electrode.

In the method of the present invention, in the step of forming the second planarizing film, the second planarizing film may be made of one resin selected from the group consisting of a polyimide resin, a novolac resin, and a phenol resin.

According to the above configuration, the second planarizing film, which is made of a resin having a lower hygroscopic property than a resin (e.g., an acrylic resin) forming the first planarizing film, can be formed by using a general-purpose resin material.

In the method of the present invention, in the step of forming the second planarizing film, the second planarizing film may be formed with a thickness in a range of 0.3 µm to 1.0 µm, both inclusive.

According to the above configuration, transparency of the second planarizing film can be ensured, and water contained in the first planarizing film can be blocked and confined by the second planarizing film without increasing the cost.

Advantages of the Invention

According to the present invention, water from a planarizing film can be reliably blocked, and reduction in luminance and uneven light emission of an organic EL layer can be prevented.

DESCRIPTION OF EMBODIMENTS

An embodiment of the present invention will be described in detail below with reference to the accompanying drawings. Note that the present invention is not limited to the following embodiment.

Figure 1:
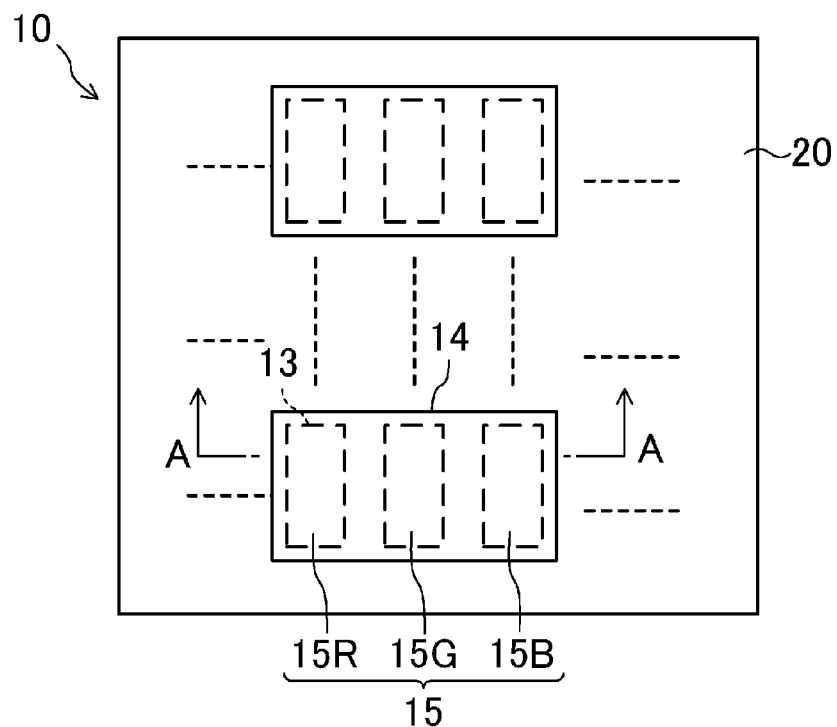
FIG. 1 is a plan view of an organic EL display device according to an embodiment of the present invention.
Figure 2:
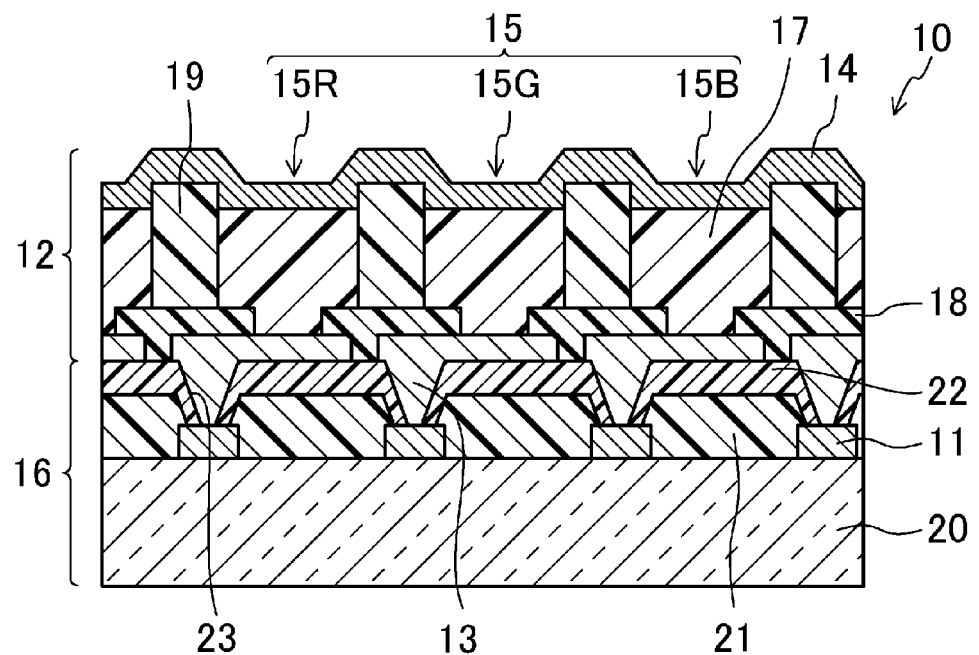
FIG. 2 is a cross-sectional view taken along line A-A in FIG. 1, and showing an organic EL element formed on thin film transistors (TFTs) as switching elements.
Figure 3:
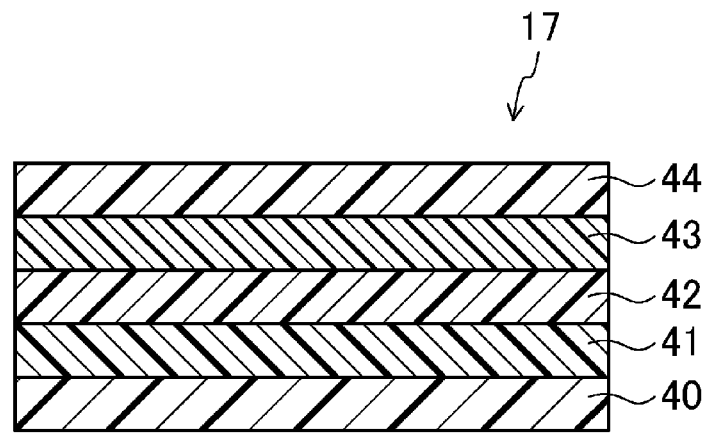
FIG. 3 is a cross-sectional view illustrating an organic EL layer that forms the organic EL element included in the organic EL display device according to the embodiment of the present invention.

FIG. 1 is a plan view of an organic EL display device according to the embodiment of the present invention. FIG. 2 is a cross-sectional view taken along line A-A in FIG. 1, and showing an organic EL element formed on thin film transistors (TFTs) as switching elements. Note that a peripheral circuit portion such as a gate driver, and an extended terminal portion of a conductive film are not shown in FIG. 1. FIG. 3 is a cross-sectional view illustrating an organic EL layer that forms the organic EL element included in the organic EL display device according to the embodiment of the present invention.

As shown in FIG. 1, in an organic EL display device 10, a plurality of pixel regions 15, each defined by first electrodes 13 and a second electrode 14 of an organic EL element 12, are arranged in a matrix pattern. In the pixel region 15, a pixel region 15R configured to emit red light, a pixel region 15G configured to emit green light, and a pixel region 15B configured to emit blue light are arranged in a predetermined pattern.

As shown in FIG. 2, the organic EL display device 10 includes the organic EL element 12 and a TFT substrate 16 (a switching element substrate).

As shown in FIG. 2, the organic EL element 12 includes: a plurality of first electrodes 13 (anodes) arranged in a predetermined pattern (e.g., a matrix pattern) on the TFT substrate 16; an organic EL layer 17 formed on each of the plurality of first electrodes 13; and the second electrode 14 formed on the organic EL layer 17.

The organic EL element 12 further includes: an edge cover 18 provided so as to cover peripheral edge portions of the first electrodes 13 and a region where the first electrodes 13 are not provided; and a rib 19 provided between the pixel regions 15R, 15G, 15B, and functioning as a partition wall that defines each pixel region 15R, 15G, 15B.

Note that in the organic EL element 12, a sealing film (not shown) may be formed so as to cover the second electrode 14, and a conductive film (not shown) may be formed on the sealing film.

As shown in FIG. 2, the TFT substrate includes: an insulating substrate 20; TFTs 11 electrically connected to the plurality of first electrodes 13 arranged in the predetermined pattern; and a first planarizing film (a first interlayer film) 21 formed on the insulating substrate 20 and covering the TFTs 11.

The first electrodes 13 have a function to inject holes into the organic EL layer 17. The first electrodes 13 are preferably made of a material having a large work function. This is because forming the first electrodes 13 from such a material can improve the efficiency of hole injection into the organic EL layer 17. As shown in FIG. 2, the first electrodes 13 are formed over the first planarizing film 21.

The first electrodes 13 can be made of a metal material such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), etc. The first electrodes 13 may be made of an alloy such as magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), lithium fluoride (LiF)/calcium (Ca)/aluminum (Al), etc. Alternatively, the first electrodes 13 may be made of a conductive oxide such as tin oxide (SnO), zinc oxide (ZnO), indium tin oxide (ITO), indium zinc oxide (IZO), etc.

The first electrodes 13 may be formed by stacking a plurality of layers each made of any of the above materials. Examples of the material having a large work function include indium tin oxide (ITO), indium zinc oxide (IZO), etc.

In the case of a bottom emission type, the first electrodes 13 are preferably made of a light transmitting material such as indium tin oxide (ITO). This configuration can reduce the rate of absorption of light from the organic EL layer 17 by the first electrodes 13, whereby high luminance can be obtained. In the case of a top emission type in which light emitted from the organic EL layer 17 is output from the side of the film formation surface, the first electrodes 13 are preferably made of a light reflecting material such as aluminum (Al). With this configuration, light emitted from the organic EL layer 17 toward the first electrodes 13 is reflected at high reflectance by the first electrodes 13 toward the second electrode 14 (a cathode). Thus, the rate of light emission from the organic EL layer 17 can be increased, whereby high luminance can be obtained.

The first planarizing film 21 is formed on the insulating substrate 20, and has a function to planarize the surface on which the TFTs 11 are formed. The first electrodes 13, the organic EL layer 17, etc., which are to be formed over the first planarizing film 21, can be formed flat due to the first planarizing film 21. That is, the first planarizing film 21 serves to reduce the possibility of uneven light emission from the organic EL layer 17 which is caused when stepped portions or concaves and convexes in a lower layer of the organic EL display device 10 affect the surface profile of the first electrodes 13. The first planarizing film 21 is made of an organic resin material such as an acrylic resin that is highly transparent and inexpensive.

Note that in order to ensure flatness and electrical insulation of the first electrodes 13, the organic EL layer 17, etc., the thickness of the first planarizing film 21 is preferably in the range of 0.3 µm to 1.0 µm, both inclusive. As shown in FIG. 2, the first electrodes 13 are electrically connected to the TFTs 11 via contact holes 23 formed in a second planarizing film (a second interlayer film) 22 described later.

The organic EL layer 17 is formed on the surface of each of the first electrodes 13 arranged in the matrix pattern. As shown in FIG. 3, the organic EL layer 17 includes: a hole injection layer 40; a hole transport layer 41 formed on the surface of the hole injection layer 40; a light emitting layer 42 formed on the surface of the hole transport layer 41 and configured to emit one of red light, green light, and blue light; an electron transport layer 43 formed on the surface of the light emitting layer 42; and an electron injection layer 44 formed on the surface of the electron transport layer 43. The organic EL layer 17 is formed by sequentially stacking the hole injection layer 40, the hole transport layer 41, the light emitting layer 42, the electron transport layer 43, and the electron injection layer 44. Note that the organic EL layer 17 may have a smaller area than the first electrode 13 formed below the organic EL layer 17, or may have a larger area than the first electrode 13 so as to cover the first electrode 13.

The hole injection layer 40 is also called an "anode buffer layer," and is used to make the respective energy levels of the first electrode 13 and the organic EL layer 17 closer to each other to improve the efficiency of hole injection from the first electrode 13 into the organic EL layer 17.

The hole injection layer 40 can be made of a material such as a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, a stilbene derivative, etc.

The hole transport layer 41 has a function to improve the efficiency of hole transport from the first electrode 13 to the organic EL layer 17. The hole transport layer 41 can be made of a material such as a porphyrin derivative, an aromatic tertiary amine compound, a styrylamine derivative, polyvinyl carbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, zinc selenide, etc.

The light emitting layer 42 is a region to which holes and electrons are injected from each of the first electrode 13 and the second electrode 14 when a voltage is applied by the first electrode 13 and the second electrode 14, and where the holes are recombined with the electrons. The light emitting layer 42 is made of a material having high luminous efficiency, and can be made of, e.g., a metal oxinoid compound [a 8-hydroxyquinoline metal complex], a naphthalene derivative, an anthracene derivative, a diphenylethylene derivative, a vinylacetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bis-styrylbenzene derivative, a trisstyrylbenzene derivative, a perylene derivative, a perinone derivative, an aminopyrene derivative, a pyridine derivative, a rhodamine derivative, an acridine derivative, phenoxazone, a quinacridone derivative, rubrene, poly-p-phenylenevinylene, polysilane, etc.

The electron transport layer 43 serves to efficiently move electrons to the light emitting layer 42. The electron transport layer 43 can be made of, e.g., an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, a metal oxinoid compound, etc.

The electron injection layer 44 is used to make the respective energy levels of the second electrode 14 and the organic EL layer 17 closer to each other to improve the efficiency of electron injection from the second electrode 14 into the organic EL layer 17. This enables the drive voltage of the organic EL element 12 to be reduced. Note that the electron injection layer is also called a "cathode buffer layer." The electron injection layer 44 can be made of an inorganic alkali compound such as lithium fluoride (LiF), magnesium fluoride ($MgF_2$), calcium fluoride ($CaF_2$), strontium fluoride ($SrF_2$), or barium fluoride ($BaF_2$), $AlO_3$, or SrO.

The second electrode 14 has a function to inject electrons into the organic EL layer 17. The second electrode 14 is more preferably made of a material having a small work function. This is because forming the second electrode 14 from such a material can improve the efficiency of electron injection into the organic EL layer 17. As shown in FIG. 2, the second electrode 14 is formed on the organic EL layer 17.

The second electrode 14 can be made of a material such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF), etc. The second electrode 14 may be made of an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), lithium fluoride (LiF)/calcium (Ca)/aluminum (Al), etc. Alternatively, the second electrode 14 may be made of a conductive oxide such as tin oxide (SnO), zinc oxide (ZnO), indium tin oxide (ITO), indium zinc oxide (IZO), etc. The second electrode 14 may be formed by stacking a plurality of layers each made of any of the above materials.

Examples of the material having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), etc.

In the case where the organic EL element 12 is of the top emission type in which light from the light emitting layer is output from the side of the second electrode 14, the second electrode 14 is preferably made of a light transmitting material such as indium tin oxide (ITO), etc. This configuration can reduce the rate of absorption of light from the light emitting layer by the second electrode 14, whereby high luminance can be obtained. On the other hand, in the case where the organic EL element 12 is of the bottom emission type in which light emitted from the light emitting layer is output from the side of the substrate, the second electrode 14 is preferably made of a light reflecting material such as aluminum (Al). With this configuration, light emitted from the light emitting layer toward the second electrode 14 is reflected at high reflectance by the second electrode 14 toward the first electrodes 13. Thus, the rate of light emission from the light emitting layer can be increased, whereby high luminance can be obtained.

The edge cover 18 has a function to prevent short-circuit between the first electrode 13 and the second electrode 14. Thus, the edge cover 18 is preferably provided so as to surround the entire peripheral edge portion of the first electrode 13.

The edge cover 18 can be made of silicon oxide ($SiO_2$), silicon nitride (SiNx (where "x" represents a positive number)) such as trisilicon tetranitride ($Si_3N_4$), silicon oxynitride (SiNO), etc.

The rib 19 may be made of, e.g., an insulating resin material such as a photosensitive polyimide resin, an acrylic resin, a metallyl resin, a novolac resin, etc.

The insulating substrate 20 has a function to ensure mechanical durability of the organic EL element 12, and a function to suppress entrance of water or oxygen from the outside into the organic EL layer 17. The insulating substrate 20 may be made of an inorganic material such as glass or quartz, plastic such as polyethylene terephthalate, ceramic such as alumina, etc.

The insulating substrate 20 may be a metal substrate of aluminum, iron, etc. having its one surface coated with an insulating material such as $SiO_2$ (silica gel) or an organic insulating material, a metal substrate of aluminum, iron, etc. having its surface subjected to an insulating process by using a method such as anodization, etc.

Note that in the case where the organic EL element 12 is of the bottom emission type in which light emitted from the organic EL element 12 is output from the side of the insulating substrate 20, namely from the surface located opposite from the element formation surface, the insulating substrate 20 is preferably made of a material having high light transmittance, such as glass, plastic, etc.

Figure 4:
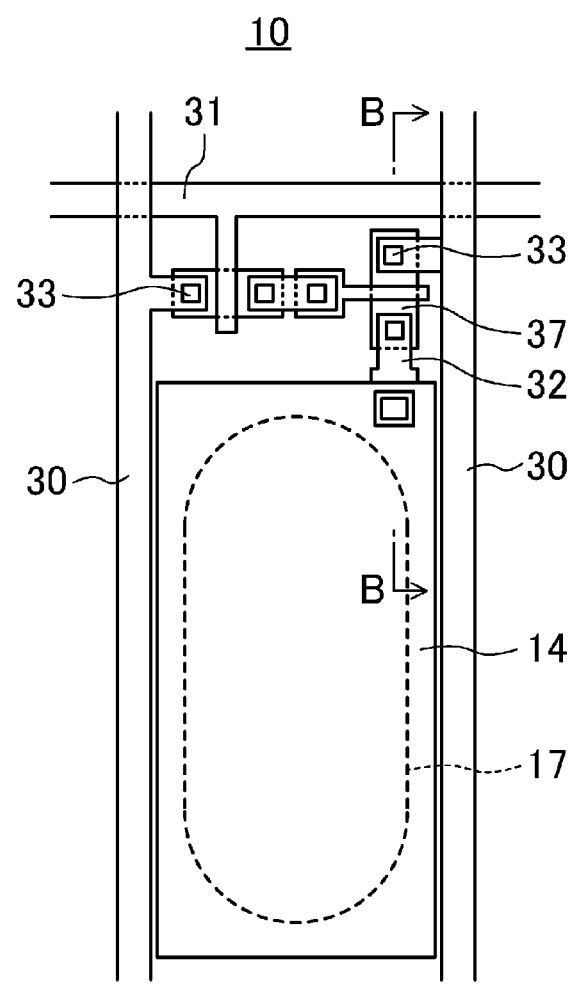
FIG. 4 is a plan view of a pixel pattern defined by source lines and gate lines in the organic EL display device.

The configuration of a pixel pattern defined by source lines and gate lines in the organic EL display device 10 will be described in detail below. FIG. 4 is a plan view showing a pixel pattern defined by source lines 30 (data lines) and gate lines 31 (scanning lines) in the organic EL display device 10, and FIG. 5 is a cross-sectional view taken along line B-B in FIG. 4.

Figure 5:
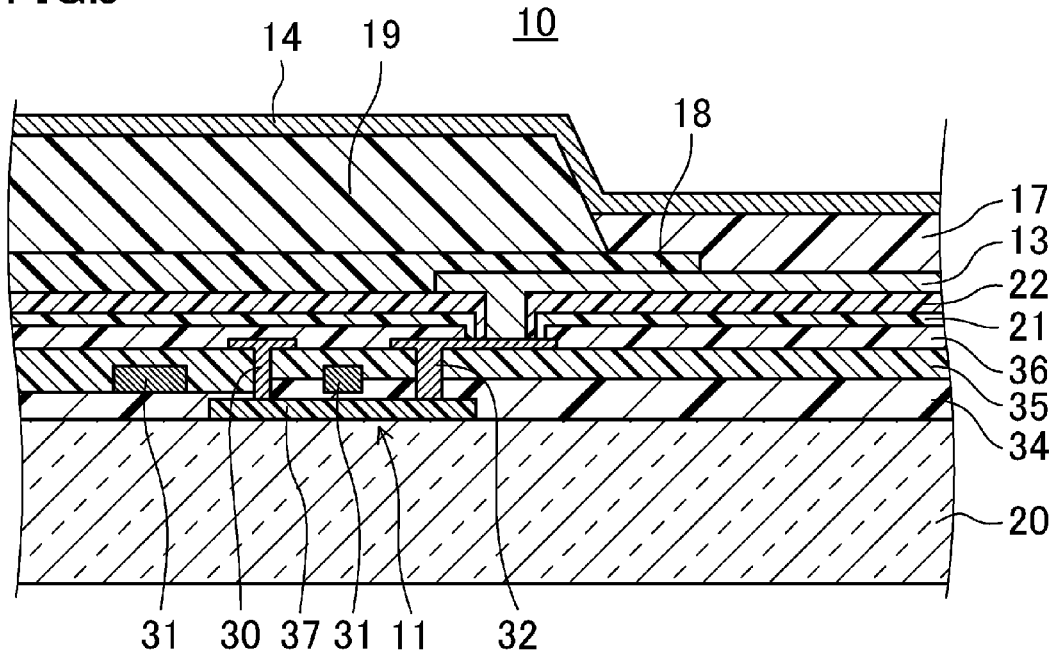
FIG. 5 is a cross-sectional view taken along line B-B in FIG. 4.

In FIGS. 4-5, each of the plurality of source lines 30 formed in a stripe shape is electrically connected to the TFT 11 in an upper-lower pattern connection region 33, and applies a data signal to the TFT 11.

The plurality of gate lines 31 extend parallel to each other in a direction crossing a direction in which the source lines 30 extend. Each of the plurality of gate lines 31 serves as the gate of the TFT 11, and applies a scanning signal to the TFT 11.

The drain of the TFT 11 is connected to a gate line 32. The gate line 32 serves as the gate of the TFT 11. A portion where the source line 30 overlaps the gate line 32 forms a storage capacitor Cs.

The source line 30 is connected to the source of the TFT 11. The drain of the TFT 11 is electrically connected to the first electrode 13. Based on the signals received from the source line 30 and the gate line 31, the TFT 11 applies charge to the storage capacitor Cs, whereby the TFT 11 is operated and supplies a current to the first electrode 13 based on an input signal. The source line 30 and the gate line 31 are made of a conductive material such as titanium (Ti), aluminum (Al), tantalum (Ta), or tungsten (W).

In FIG. 5, a gate insulating film 34 is formed on the insulating substrate 20 of the TFT substrate 16. A material that forms the gate insulating film 34 is not particularly limited, and the gate insulating film 34 can be made of, e.g., silicon oxide ($SiO_2$), a material having a lower dielectric constant than silicon oxide, such as SiOF or SiOC, silicon nitride SiNx (where "x" represents a positive number) such as trisilicon tetranitride ($Si_3N_4$), silicon oxynitride (SiNO), titanium dioxide ($TiO_2$), dialuminum trioxide ($Al_2O_3$), tantalum oxide such as tantalum pentoxide ($Ta_2O_5$), hafnium dioxide ($HfO_2$), a material having a higher dielectric constant than silicon oxide, such as zirconium dioxide ($ZrO_2$), etc.

First and second interlayer insulating films 35, 36 are formed on the gate insulating film 34. A material that forms each of the first and second insulating films 35, 36 is not particularly limited, and the first and second insulating films 35, 36 may be made of, e.g., silicon oxide ($SiO_2$), silicon nitride (SiNx (where "x" represents a positive number)).

A semiconductor layer 37 of the TFT 11 may be made of polysilicon (Si), etc., and source and drain electrodes of the TFT 11 are made of aluminum, etc.

Note that although the TFT 11 is used as a switching element in the present embodiment, a metal-insulator-metal (MIM) diode, etc. may be used instead of the TFT 11.

Although the TFT substrate 16 having a top gate structure is shown in the present embodiment, the TFT substrate 16 may have a bottom gate structure. A semiconductor formation region of the TFT 11 may include amorphous silicon, microcrystalline silicon, polysilicon, or an oxide semiconductor such as zinc oxide.

In the organic EL display device 10, the TFT 11 in each pixel is operated based on signals of a data line drive circuit and a scanning line drive circuit. Thus, the TFT 11 in each pixel is driven, and a current flows in the organic EL element 12, whereby the organic EL element 12 emits light, and an image is displayed.

A feature of the present embodiment is that the second planarizing film 22 covering the first planarizing film 21 is formed between the first electrode 13 and the first planarizing film 21, as shown in FIG. 2.

The second planarizing film 22 is made of a resin having a lower hygroscopic property than the resin (that is, an acrylic resin) forming the first planarizing film 21.

Note that as used herein, the term "hygroscopic property" typically refers to the water absorption rate as measured according to JIS K7209, and the "low hygroscopic property" means that the water absorption rate is low. However, in the case of a thin film having a thickness of less than 5 μm as in the present embodiment, the volume of the resin is very small, and the resin absorbs only a small amount of water. Accordingly, the water absorption rate of such a thin film may not be measured with sufficient accuracy by the method according to JIS K7209.

Thus, the following method was separately used to measure the water absorption rate. An acrylic resin and a polyimide resin were respectively applied with a thickness of 2 μm to square glass substrates of 10 cm by 10 cm, and the resultant glass substrates were baked at 200° C. and 250° C., respectively, for one hour in a nitrogen atmosphere. Next, the glass substrates were left for 24 hours in the atmosphere, and then were baked at 200° C. for 10 minutes in a nitrogen atmosphere to remove water on the resin surface. Thereafter, the amount of released water was measured by a mass spectrometer while increasing the temperature from 25° C. to 300° C. at a rate of 10° C./min under a vacuum of $10^{-2}$ Pa.

In the above method, it is difficult to obtain an absolute water absorption rate, but relative comparison of the water absorption rate can be made between the resins. In this case, the more the detected amount of water is, the higher the water absorption rate is. If the water absorption rate of the acrylic resin was regarded as "1," the water absorption rate of the polyimide resin was "0.53." This shows that the water absorption rate of the polyimide resin is significantly lower than that of the acrylic resin, and the polyimide resin is a resin having a lower hygroscopic property than the acrylic resin.

In this configuration, the second planarizing film 22 is formed so as to cover the first planarizing film 21 made of an acrylic resin having a high hygroscopic property. Accordingly, even if water has been accumulated in the first planarizing film 21, the water contained in the first planarizing film 21 can be blocked and confined by the second planarizing film 22.

This configuration can reliably prevent leakage of water from the first planarizing film 21 to the first electrode 13. Thus, the water can be prevented from reaching the first electrode 13 and the organic EL layer 17 that forms the organic EL element 12, thereby preventing damage to the peripheral portions of the first electrode 13 and the organic EL layer 17 due to the water.

In the above configuration, the second planarizing film 22 is formed between the first electrode 13 and the first planarizing film 21, and the first planarizing film 21 made of a resin is covered by the second planarizing film 22 made of a resin, thereby improving adhesion between the first planarizing film 21 and the second planarizing film 22. Thus, accumulation of water and formation of a void in the interface between the first planarizing film 21 and the second planarizing film 22 can be prevented. As a result, leakage of water from the first planarizing film 21 to the first electrode 13 can be reliably prevented, whereby delamination and cracks can be prevented from occurring in the first planarizing film 21 and the first electrode 13 due to leakage of water from the first planarizing film 21 and entrance of the water into a region between the first planarizing film 21 and the first electrode 13.

As shown in FIG. 2, the first planarizing film 21 is covered by the second planarizing film 22 even in the contact hole 23 formed in the second planarizing film 22, the first planarizing film 21 can be prevented from contacting the first electrode 13 in the contact hole 23. Thus, leakage of water from the first planarizing film 21 to the first electrode 13 via the contact hole 23 can be reliably prevented.

The resin material forming the second planarizing film 22 is not particularly limited as long as the resin material has a lower hygroscopic property than the resin (that is, an acrylic resin) forming the first planarizing film 21. For example, the second planarizing film 22 is preferably made of a polyimide resin, a novolac resin, a phenol resin, etc.

The polyimide resin is particularly preferable among these resins. This is because the polyimide resin has high thermal resistance, a high electrical insulation property, and is capable of closely adhering to a metal wiring and a silicon film.

Note that the relation in the water absorption rate between the acrylic resin forming the first planarizing film 21 and the polyimide resin forming the second planarizing film 22 is as described above. The water absorption rate of the polyimide resin is significantly lower than that of the acrylic resin, and thus the polyimide resin is a resin having a lower hygroscopic property than the acrylic resin.

The thickness of the second planarizing film 22 is preferably in the range of 0.3 μm to 1.0 μm, both inclusive. If the thickness of the second planarizing film 22 is less than 0.3 μm, it may be difficult for the second planarizing film 22 to sufficiently block and confine water contained in the first planarizing film 21. If the thickness of the second planarizing film 22 is larger than 1.0 μm, and the second planarizing film 22 is made of, e.g., a polyimide resin, transparency of the second planarizing film cannot be ensured in the case of the bottom emission type because the polyimide resin is a colored resin. Moreover, in the case where the second planarizing film 22 is made of a polyimide resin, the cost may be increased because the polyimide resin is expensive.

Note that the first planarizing film 21 may be made of the polyimide resin forming the second planarizing film 22, etc. However, as described above, the polyimide resin is a colored resin, and also is expensive. Thus, forming the first planarizing film 21, having a larger thickness than the second planarizing film 22, from the polyimide resin, etc. causes disadvantages due to a change in color of light emitted from the organic EL display device 10 and in terms of the cost.

An example of a method for manufacturing an organic EL display device according to the present embodiment will be described below. FIGS. 6-9 are cross-sectional views illustrating the method for manufacturing an organic EL display device according to the embodiment of the present invention.

Figure 6:
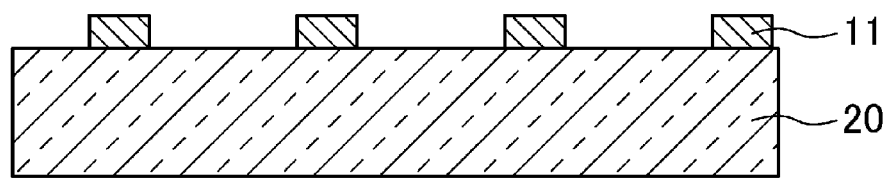
FIG. 6 is a cross-sectional view illustrating a method for manufacturing an organic EL display device according to the embodiment of the present invention.

First, as shown in FIG. 6, a plurality of TFTs configured to drive an organic EL element 12 are formed at predetermined intervals on an insulating substrate 20 such as a glass substrate having a size of 320 mm by 400 mm and a thickness of 0.7 mm.

Figure 7:
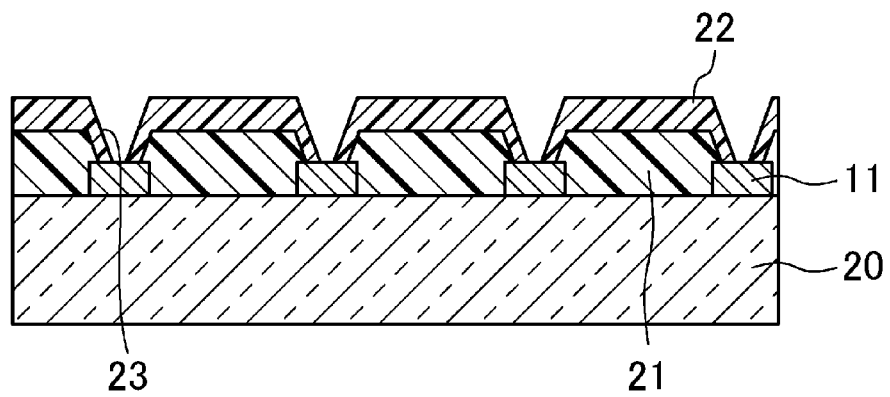
FIG. 7 is a cross-sectional view illustrating the method for manufacturing an organic EL display device according to the embodiment of the present invention.

Next, as shown in FIG. 7, a photosensitive acrylic resin is applied by a spin coating method to the insulating substrate 20 having the TFTs 11 formed thereon. Exposure is performed by a predetermined exposure amount (e.g., 360 mJ/cm$^2$) by using an exposure mask having a predetermined exposure pattern, and development is performed by using an alkaline developer, thereby forming a first planarizing film 21 having a thickness of, e.g., 2 μm. Note that after the development, baking is performed under predetermined conditions (e.g., at 220° C. for 60 minutes) as postbaking.

Thereafter, as shown in FIG. 7, a photosensitive polyimide resin is applied by a spin coating method to the first planarizing film 21 formed on the insulating substrate 20. Exposure is performed by a predetermined exposure amount (e.g., 60 mJ/cm$^2$) by using an exposure mask having a predetermined exposure pattern, and development is performed by using an alkaline developer, whereby a second planarizing film 22 having a thickness of, e.g., 0.3 μm is formed so as to cover the first planarizing film 21. Note that after the development, baking is performed under predetermined conditions (e.g., at 220° C. for 120 minutes) as postbaking. At this time, contact holes 23 (e.g., a diameter of 5 μm) configured to electrically connect first electrodes 13 to the TFTs 11 are formed in the second planarizing film 22.

Figure 8:
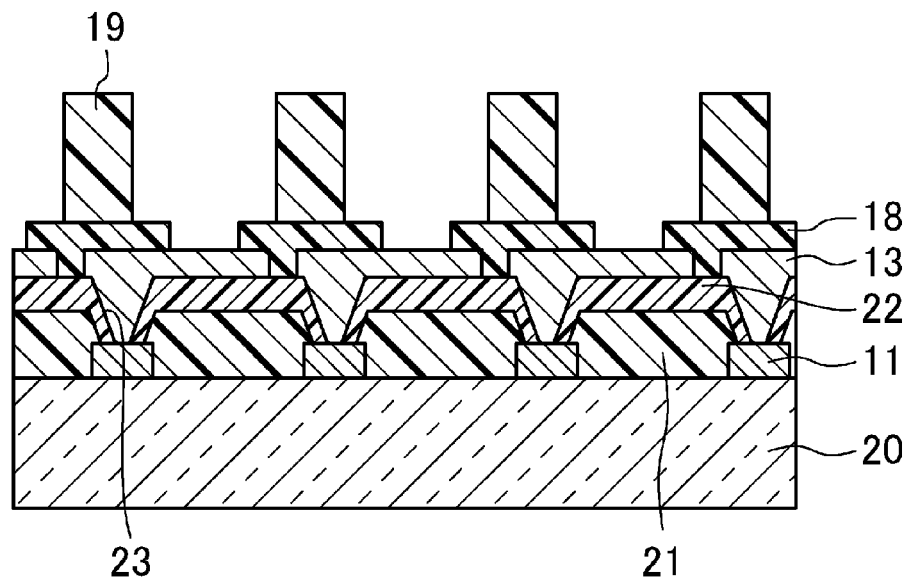
FIG. 8 is a cross-sectional view illustrating the method for manufacturing an organic EL display device according to the embodiment of the present invention.

Then, as shown in FIG. 8, an ITO film is formed by a sputtering method, exposure and development is performed by photolithography, and patterning is performed by using an etching technique, whereby a plurality of first electrodes 13 are formed on the second planarizing film 22. At this time, the first electrodes 13 are formed with a thickness of, e.g., about 100 nm. Note that after the development, baking is performed under predetermined conditions (e.g., at 220° C. for 120 minutes) as postbaking.

The first electrodes 13 are electrically connected to the TFTs 11 via the contact holes 23 formed in the second planarizing film 22. At this time, since the first electrodes 13 are formed on the second planarizing film 22, the second planarizing film 22 is placed between the first electrodes 13 and the first planarizing film 21.

Subsequently, as shown in FIG. 8, a silicon oxide film is formed by a sputtering method in the peripheral edge portions of the first electrodes 13. Exposure and development are performed by photolithography, and patterning is performed by using an etching technique, whereby an edge cover 18 is formed so as to cover the entire peripheral edge portions of the first electrodes 13. At this time, the edge cover 18 is formed with a thickness of, e.g., about 150 nm.

Then, as shown in FIG. 8, a photosensitive polyimide resin, for example, is patterned in a manner similar to that of the first planarizing film 21 to form a rib 19 on the edge cover 18. At this time, the rib 19 is formed with a thickness of, e.g., about 1.7 μm.

Thereafter, an organic EL layer 17 including a light emitting layer 42 is formed on the first electrodes 13, and then a second electrode 14 is formed on the organic EL layer 17. The organic EL layer 17 and the second electrode 14 are formed by a vapor deposition method by using a metal mask.

More specifically, an element substrate including the first electrodes 13 shown in FIG. 8 is first placed in a chamber of a vapor deposition apparatus. Note that the inside of the chamber of the vapor deposition apparatus is maintained at a degree of vacuum of $1\times10^{-5}$ to $1\times10^{-4}$ (Pa) by a vacuum pump. The element substrate including the first electrodes 13 is placed with its two sides being fixed by a pair of substrate holders attached to the inside of the chamber.

Then, respective vapor deposition materials of a hole injection layer 40, a hole transport layer 41, a light emitting layer 42, an electron transport layer 43, and an electron injection layer 44 are sequentially evaporated from a vapor deposition source to sequentially stack the hole injection layer 40, the hole transport layer 41, the light emitting layer 42, the electron transport layer 43, and the electron injection layer 44. Thus, the organic EL layer 17 is formed in each pixel region.

Figure 9:
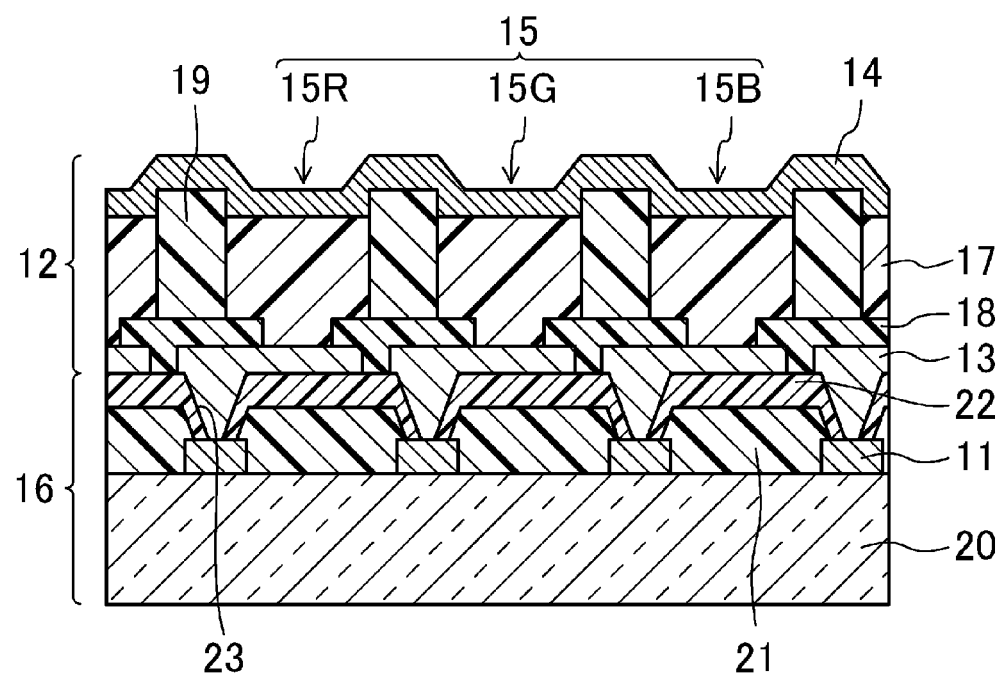
FIG. 9 is a cross-sectional view illustrating the method for manufacturing an organic EL display device according to the embodiment of the present invention.

Then, as shown in FIG. 9, a second electrode 14 is formed on the organic EL layer 17, whereby an organic EL element 12 having the first electrodes 13, the organic EL layer 17, and the second electrode 14 is formed on the element substrate.

Note that, for example, a crucible containing the vapor deposition materials can be used as the vapor deposition source. The crucible is placed in a lower part of the chamber, and is provided with a heater. The crucible is heated by this heater.

As the crucible is heated by the heater, the temperature inside the crucible reaches an evaporating temperature of each vapor deposition material, whereby each vapor deposition material contained in the crucible is evaporated, and the resultant evaporated molecules move upward in the chamber.

As a specific example of a method for forming the organic EL layer 17 and the second electrode 14, a hole injection layer 40, which is made of 4,4,4-tris(3-methylphenylphenylamino) triphenylamine (m-MTDATA) and is common to the RGB pixels, is first formed with a thickness of, e.g., 25 nm via a mask on the first electrode 13 patterned on the element substrate.

Next, a hole transport layer 41, which is made of 4,4-bis (N-1-naphthyl-N-phenylamino)biphenyl (α-NPD) and is common to the RGB pixels, is formed with a thickness of, e.g., 30 nm on the hole injection layer 40 via a mask.

Then, as a red light emitting layer 42, a layer of a mixture of di(2-naphthyl)anthracene (ADN) with 30 wt % of 2,6-bis ((4'-methoxydiphenylamino)styryl)-1,5-dicyanonaphthalene (BSN) is formed with a thickness of, e.g., 30 nm on the hole transport layer 41 formed in the pixel region, via a mask.

Thereafter, as a green light emitting layer 42, a layer of a mixture of ADN with 5 wt % of coumarin6 is formed with a thickness of, e.g., 30 nm on the hole transport layer 41 formed in the pixel region, via a mask.

Subsequently, as a blue light emitting layer 42, a layer of a mixture of ADN with 2.5 wt % of 4,4'-bis(2-{4-(N,N-diphenylamino)phenyl}vinyl)biphenyl (DPAVBi) is formed with a thickness of, e.g., 30 nm on the hole transport layer 41 formed in the pixel region, via a mask.

Then, as an electron transport layer 43, a layer of 8-hydroxyquinoline aluminum (Alq3), which is common to the RGB pixels, is formed with a thickness of, e.g., 20 nm on each light emitting layer 42 via a mask.

Thereafter, as an electron injection layer 44, a layer of lithium fluoride (LiF) is formed with a thickness of, e.g., 0.3 nm on the electron transport layer 43.

Subsequently, as a second electrode 14, a second electrode made of magnesium silver (MgAg) is formed with a thickness of, e.g., 10 nm.

The organic EL display device 10 shown in FIG. 2 is manufactured in this manner.

Note that in order to protect the organic EL layer 17 from water or gas in the atmosphere, the organic EL display device 10 may be configured to be sealed by a sealing film (not shown) after the second electrode 14 is formed. This sealing film may be made of a single film including any one of materials of an insulating film, such as silicon oxide ($SiO_2$), silicon nitride (SixNy, where "x" and "y" are a real number larger than "0"), silicon oxynitride (SiON), etc., or may be made of a stacked film including two kinds or more of these materials.

The following advantages can be obtained according to the embodiment described above.

(1) In the present embodiment, the second planarizing film 22 covering the first planarizing film 21 is formed between the first electrode 13 and the first planarizing film 21. Moreover, the second planarizing film 22 is made of a resin having a lower hygroscopic property than a resin (that is, an acrylic resin) forming the first planarizing film 21. Thus, the second planarizing film 22 is formed so as to cover the first planarizing film 21 made of the acrylic resin having a higher hygroscopic property. Accordingly, even if water has been accumulated in the first planarizing film 21, the water contained in the first planarizing film 21 can be blocked and confined by the second planarizing film 22. This configuration can reliably prevent leakage of water from the first planarizing film 21 to the first electrode 13. Thus, the water can be prevented from reaching the first electrode 13 and the organic EL layer 17 that forms the organic EL element 12, thereby preventing damage to the peripheral portions of the first electrode 13 and the organic EL layer 17 due to the water. As a result, reduction in luminance and uneven light emission of the organic EL element 12 can be reliably prevented.

(2) The second planarizing film 22 is formed between the first electrode 13 and the first planarizing film 21, and the first planarizing film 21 made of a resin is covered by the second planarizing film 22 made of a resin, thereby improving adhesion between the first planarizing film 21 and the second planarizing film 22. Thus, accumulation of water and formation of a void in the interface between the first planarizing film 21 and the second planarizing film 22 can be prevented. As a result, leakage of water from the first planarizing film 21 to the first electrode 13 can be reliably prevented, whereby delamination and cracks can be prevented from occurring in the first planarizing film 21 and the first electrode 13 due to leakage of water from the first planarizing film 21 and entrance of the water into a region between the first planarizing film 21 and the first electrode 13.

(3) In the present embodiment, the second planarizing film 22 is made of one resin selected from a polyimide resin, a novolac resin, and a phenol resin. Thus, the second planarizing film 22, which is made of a resin having a lower hygroscopic property than a resin (e.g., an acrylic resin) forming the first planarizing film 21, can be formed by using a general-purpose resin material.

(4) In the present embodiment, the second planarizing film 22 is designed to have a thickness in the range of 0.3 μm to 1.0 μm, both inclusive. Thus, transparency of the second planarizing film 22 can be ensured, and water contained in the first planarizing film 21 can be blocked and confined by the second planarizing film 22 without increasing the cost.

Note that the above embodiment may be modified as follows.

In the above embodiment, the organic EL layer 17 has a five-layer stacked structure formed by the hole injection layer 40, the hole transport layer 41, the light emitting layer 42, the electron transport layer 43, and the electron injection layer 44. However, the present invention is not limited to the five-layer stacked structure, and the organic EL layer 17 may have, e.g., a three-layer structure formed by a layer serving as both a hole injection layer and a hole transport layer, a light emitting layer, and a layer serving as both an electron transport layer and an electron injection layer.

The stacked structure may be inverted so that the first electrodes 13 serves as a cathode and the second electrode 14 serves as an anode. In this case, the stacked structure is formed by sequentially stacking, from bottom to top, the first electrode 13 as a cathode, the electron injection layer 44, the electron transport layer 43, the light emitting layer 42, the hole transport layer 41, the hole injection layer 40, and the second electrode 14 as an anode. In this case, the materials of the first electrode 13 and the second electrode 14 are also switched therebetween.

The organic EL display device 10 of the present invention may have one of the bottom emission structure in which light is emitted to the outside from the side of the TFT substrate 16, and the top emission structure in which light is emitted to the outside from the opposite side from the TFT substrate 16 (that is, the side of the organic EL element 12). However, in the case of the top emission structure, light need be reflected by the first electrode 13, and light need be output from the second electrode 14. Thus, for example, a layer formed by stacking ITO on Al may be used as the first electrode 13, and a layer formed by stacking ITO on semitransparent Ag having a thickness of about 20 nm may be used as the second electrode 14. In this case, Al of the first electrode 13 has a reflecting function, and ITO of the first electrode 13 has a function to inject holes into the light emitting layer 42. Moreover, Ag of the second electrode 14 has a function to inject electrons into the light emitting layer 42, and ITO has a function as an auxiliary electrode that reduces resistance of the second electrode 14.

INDUSTRIAL APPLICABILITY

As described above, the present invention is suitable for organic EL display devices including an organic EL panel having organic EL elements, and manufacturing methods thereof.

DESCRIPTION OF REFERENCE CHARACTERS

10 Organic EL Display Device
11 TFT (Switching Element)
12 Organic EL Element
13 First Electrode
14 Second Electrode
15 Pixel Region
16 TFT Substrate (Switching Element Substrate)
17 Organic EL Layer
18 Edge Cover
19 Rib
20 Insulating Substrate
21 First Planarizing Film
22 Second Planarizing Film
23 Contact Hole
40 Hole Injection Layer
41 Hole Transport Layer
42 Light Emitting Layer
43 Electron Transport Layer
44 Electron Injection Layer

The invention claimed is:

1. An organic EL display device, comprising:
an insulating substrate;
a planarizing film formed on the insulating substrate and made of a resin;
a first electrode formed on the planarizing film;
an organic EL layer formed on the first electrode;
a second electrode formed on the organic EL layer; and
an interlayer film formed between the first electrode and the planarizing film, and covering the planarizing film, wherein
a thickness of the planarizing film is larger than that of the interlayer film,
the interlayer film is made of a resin having a lower hygroscopic property than the resin forming the planarizing film,
the interlayer film is formed so as to confine water contained in the planarizing film,
the interlayer film covers an upper surface and side surfaces of the planarizing film, and
the planarizing film covers a TFT.

2. The organic EL display device of claim 1, wherein
the interlayer film is made of one resin selected from the group consisting of a polyimide resin, a novolac resin, and a phenol resin.

3. The organic EL display device of claim 1, wherein
the interlayer film has a thickness in a range of 0.3 μm to 1.0 μm, both inclusive.

4. The organic EL display device of claim 1, further comprising:
a switching element substrate including the insulating substrate, and a switching element formed on the insulating substrate and electrically connected to the first electrode.

5. A method for manufacturing an organic EL display device, comprising at least the steps of:
forming, on an insulating substrate, a planarizing film made of a resin;
forming, on the planarizing film, an interlayer film made of a resin having a lower hygroscopic property than the resin forming the planarizing film, so as to cover the planarizing film, wherein
a thickness of the planarizing film is larger than that of the interlayer film,
the interlayer film is formed so as to confine water contained in the planarizing film,
the interlayer film covers an upper surface and side surfaces of the planarizing film, and
the planarizing film covers a TFT;
forming a first electrode on the interlayer film so that the interlayer film is placed between the first electrode and the planarizing film;
forming an organic EL layer on the first electrode; and
forming a second electrode on the organic EL layer.

6. The method of claim 5, wherein
in the step of forming the interlayer film, the interlayer film is made of one resin selected from the group consisting of a polyimide resin, a novolac resin, and a phenol resin.

7. The method of claim 5, wherein
in the step of forming the interlayer film, the interlayer film is formed with a thickness in a range of 0.3 μm to 1.0 μm, both inclusive.

* * * * *